Oct. 6, 1959 C. J. STEINKE 2,907,298

FREQUENCY CHANNEL INDICATOR

Filed March 14, 1958

Inventor
Carl J. Steinke
By Francis W. Crotty
Attorney

United States Patent Office 2,907,298

Patented Oct. 6, 1959

2,907,298

FREQUENCY CHANNEL INDICATOR

Carl J. Steinke, Des Plaines, Ill., assignor to Zenith Radio Corporation, a corporation of Delaware Application March 14, 1958, Serial No. 721,445

12 Claims. (Cl. 116—124.4)

This invention is directed to a frequency channel indicator for a wave-signal receiver, and more particularly to such an indicator which displays upon an adjustment knob in the front panel of the receiver cabinet a clear visual indication of the frequency to which the receiver is tuned in spite of the fact that the adjustment knob in question is not the channel selector of the receiver.

Frequency channel indicators of various types are known and are especially beneficial in television receivers. In such an environment, it is possible for the viewer who normally observes the receiver from a considerable distance to determine the exact frequency channel to which the receiver is tuned without having to approach the instrument. Only a glance at the channel indicator is needed when the indicator is, for example, of the type disclosed and claimed in U.S. Patent No. 2,681,634 for "Channel Indicator for Televisions," issued June 22, 1954 to Eugene J. Polley, and assigned to the assignee of this invention. The Polley structure is a salutary means for legibly and clearly displaying the selected channel identification number on the presentation surface of a channel-selector knob coupled to the television receiver's tuning device to permit manual channel selection.

More recently, however, various cabinet constructions and operating improvements have made possible the removal of the channel selection knob from the front panel of the cabinet. Such a construction is desirable in that the removal of protuberances such as tuning knobs both minimizes the possibility of injury to children and reduces the chance of inadvertent breakage during ordinary household cleaning, moving, etc. The widespread acceptance of remote control tuning systems for television receivers further encourages the removal of the channel selection knob from the front panel; with such an arrangement the tuning device of the receiver is driven by a bi-directional motor which is energized by a control chassis. Such chassis accepts signals from a source that is remote (that is, external to) from the receiver itself, and the frequency of the received signal determines the direction as well as the extent of tuner adjustment effected by the driving motor. In order to facilitate tuning when a person is close to the cabinet, a pair of push buttons are provided as an additional control of the tuning motor. The particular button actuated determines the direction in which the motor drives the tuning device.

Of course, it is recognized that there may be a motor failure, or for some other reason it may be convenient to have manual control of the tuning device and, for that purpose, a manual control may be unobtrusively positioned in a panel other than the front panel of the receiver cabinet. Notwithstanding the positioning of the auxiliary channel selector knob on the rear or other panel of the cabinet, it is still highly desirable that a visual indication of the selected channel be manifest on the front panel of the cabinet.

It is therefore an object of this invention to provide a frequency channel indicator incorporated in an adjustment knob, other than the channel selection knob, located in the front panel of the receiver cabinet.

It is a further object of the invention to provide a frequency channel indicator for a wave-signal receiver which provides the desired indication of operating frequency with a minimum of added component parts.

It is a specific object of the invention to provide a channel indication in the front panel of a television receiver which has a manual channel selector positioned in a panel other than the front panel.

A wave-signal receiver constructed in accordance with the invention comprises a cabinet including a front panel presenting a viewing area and a plurality of other panels; the front and remaining panels collectively define an enclosure. Means are included for selectively tuning the receiver to any of a plurality of frequency channels, and in one of the cabinet panels other than the front panel, control means are disposed and coupled to the tuning means for actuating the tuning means. In the front panel is disposed an adjustment knob for varying an operating characteristic of the receiver during the reception of any selected channel; this knob has an exposed portion including a translucent screen area. An index member has indicia shaped to designate the different frequency channels, and this member is mounted for movement to present the indicia sequentially at a reference position. The tuning means is mechanically linked to the index member, so that movement of the index member is effected when the tuning means is actuated, and a light source is positioned to project onto the screen an image of the particular index in the reference position.

The features of this invention which are believed to be novel are set forth with particularity in the appended claims. The invention, together with further objects and advantages thereof, may best be understood, however, by reference to the following description taken in conjunction with the accompanying drawings, in the several figures of which like reference numerals identify like elements, and in which:

Figures 1, 2, 3:
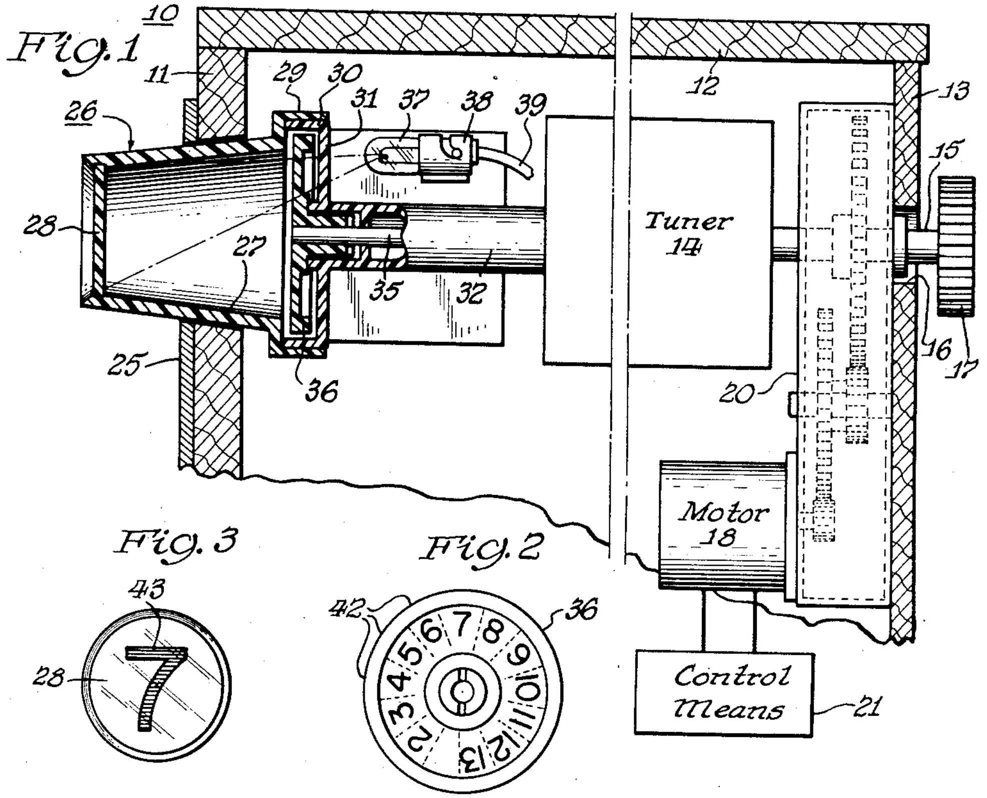
Figure 1 is a side view, partly in section, of an embodiment of the invention.
Figures 2 and 3 are front views of separate elements of the embodiment shown in Figure 1.

A television receiver embodying the invention comprises, as shown in Figure 1, a cabinet 10 including a front panel 11 in which is disposed a viewing area, such as a transparent shield member (not shown) protecting the viewing surface of a cathode-ray tube (not shown); cabinet 10 further includes a top panel 12, and a rear panel 13 which, with the other panels not shown in the drawing, collectively define an enclosure for the receiver. A tuner 14 positioned within the cabinet comprises the conventional channel selection mechanism and the fine, or vernier, tuning means, both of which are well known and understood in the art and thus are not illustrated. Tuner 14 may take the form of the VHF—UHF turret tuner described and claimed in Patent No. 2,810,827, issued to R. M. Nordby on October 22, 1957, and assigned to the assignee of this invention. The channel selection mechanism within tuning means 14 is coupled to a shaft 15 which extends through an aperture 16 in rear panel 13 of cabinet 10. A selector knob 17 is mounted on the end of shaft 15 to provide for manual actuation of the channel selection mechanism.

The channel selection mechanism can also be actuated by rotation of shaft 15 effected by power translated from an electric motor 18 through a gear train housed in a gear box 20. Motor 18 is selectively energized from a control means 21, which may take any of a number of forms. For example, control means 21 may include one or more push buttons positioned in the front panel of cabinet 10 for selectively completing an energization circuit for motor 18. Alternatively, control means 21 may comprise a control chassis for accepting tuning information from a remote source and for translating commands based on this information to motor 18. Such means are well known and understood by those skilled in the art, and may take the form of the control system disclosed and claimed in Patent No. 2,817,025, issued to Robert Adler on December 17, 1957, and assigned to the assignee of this invention.

An escutcheon member 25 is affixed to the front panel 11 of the cabinet. An adjustment knob 26 is positioned within corresponding apertures provided in front panel 11 and escutcheon member 25. The knob 26 has a substantially cylindrical portion 27 terminated at one end in an exposed translucent screen area 28. A suitable annular groove may be provided in cylindrical portion 27 and screen 28 can be snapped into place, or the screen can be affixed by glue or other suitable adhesive substance or may otherwise be fixed in position mechanically.

The rear portion 29 of cylindrical member 27 is affixed by suitable joining means such as glue, solder, or a press fit, to a mating section 30 of the disc-like extension 31 formed at one end of a hollow cylindrical shaft 32. The shaft 32 is coupled to means for varying an operating or amplitude characteristic of the receiver other than channel selection. It may, by way of illustration, be coupled to the fine tuning control included within tuner 14 to adjust the operating frequency in a manner which will be described hereinafter.

Journalled within hollow shaft 32 and coupled to the channel selection means (not shown) within tuner 14 is another shaft member 35. When the tuner is of the turret type, this shaft may be an extension of the rotor shaft. The end of shaft 35 remote from tuner 14 is secured within a mating cylindrical aperture at the center of an index member 36, which is disc-shaped and bears indicia, such as channel numerals, each of which is shaped to designate a particular one of the frequency channels to which the receiver may be tuned. Index member 36 is mounted for movement to present the channel indicia sequentially at a reference position. In the illustrated embodiment, this reference position lies on a radius drawn vertically upward from the center of index member 36. A light source 37, which may be an ordinary bulb such as is used to illuminate the tuning dial of a radio receiver, is mounted in a bracket 38 and connected over cable 39 to a source of operating potential (not shown). At least the disc-like extension 31 of hollow shaft 32 is constructed of transparent plastic; the entire shaft member 32 may be a unitary plastic piece. Alternatively, extension 31 can be made opaque and apertured to include a series of openings to permit light rays to pass from the light source 37, thence through the reference position and index member 36, to screen 28. Whether constructed of transparent plastic or apertured, the disc-like extension 31 comprises a plurality of adjacent light-transparent portions. Further, light source 37 is positioned to project onto screen 28 an image of the one of the indicia which is at any particular instant located at the reference position.

Figure 2 shows the front of index member 36. As there shown, member 36 comprises a plurality of adjacent transparent portions 42 contiguous to each other. On portions 42, a plurality of indicia, illustrated as VHF channel indication numerals 2–13, are disposed. The dashed lines between adjacent transparent portions indicate that member 36 has been weakened along these lines so that the index, or channel number, for any given frequency channel can readily be removed and a different index element substituted therefor. This construction is especially advantageous in an area in which there are both VHF and UHF television stations so long as tuner 14 is adapted to convert both UHF and VHF signals to the same intermediate frequency; in that case the local UHF channel numbers can be advantageously inserted in place of punched-out VHF channel indicia on index member 36. Thus the necessity of an entirely separate frequency channel indicator system for UHF channels 14–83, inclusive, is obviated.

In operation, adjustment knob 26 of Figure 1 is utilized to accomplish fine tuning adjustments of the television receiver whereas channel selection is governed by control means 21 or manual selection knob 17. When a television channel is selected by operating control means 21 or tuning knob 17 to actuate tuner 14, shaft 35 is rotated to a particular angular orientation and in turn effects the rotation of index member 36 to a corresponding preselected orientation. Rotation of the member 36 presents a numeral designating the selected channel index at the reference position, interposed between light source 37 and translucent screen 28. The designation on member 36 may comprise dark numerals painted or otherwise imprinted on the transparent section and it is projected as an image of the particular frequency channel index onto screen 28 as shown in Figure 3, where the dark area 43 denotes channel number 7. Alternatively, member 36 may be opaque and the various indicia may be formed sections of translucent material to project a light image of the channel number onto the dark background of screen 28.

Whenever the channel selector mechanism within tuner 14 is rotated, index member 36 is simultaneously rotated to effect a corresponding change in the index image projected onto screen 28. If adjustment knob 26 is rotated to sharpen the tuning on any selected channel, the position of index member 36 is unaffected; accordingly, the index image appearing on screen 28 is dependent only upon the position of the channel selector mechanism.

Figure 4:
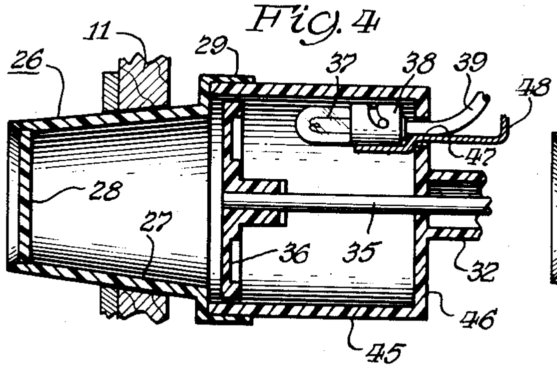
Figure 4 is a side view, partly in section, of another embodiment of the invention.
Figure 5:
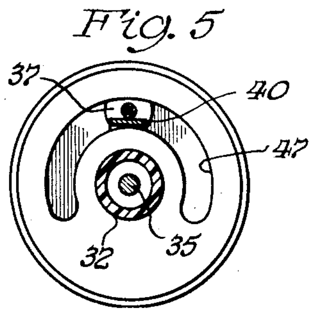
Figure 5 is a rear view, partly in section, of the embodiment shown in Figure 4.

Figure 4 illustrates another embodiment of the invention in which the disc-like extension 31 of hollow shaft 32 of the embodiment of Figure 1 is replaced by a cylindrical end portion 45 which encircles both index member 36 and light source 37. The open end of cylindrical portion 45 is joined to portion 29 of adjustment knob 26. As shown more clearly in Figure 5, the wall section 46 of cylindrical portion 45 includes a semi-circular channel or aperture 47. Channel 47 is provided for the electrical cable 39 and for a suitable extension bracket 48 which supports light bracket 38. Bracket 48 also functions as a mechanical stop to prevent rotation of the hollow shaft member 32 through more than 180°, to prevent the forcible disconnection of the light 37 from the power source.

Figure 6:
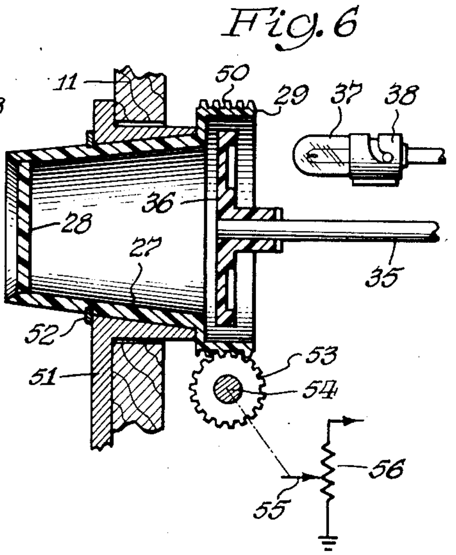
Figure 6 is a side view, partly in section, of a different embodiment of the invention.

In Figure 6, light source 37, index member 36, and screen 28 cooperate as explained above to display a frequency channel index image on the front surface of screen 28. However, in this embodiment the inner end portion 29 of knob 26 has a worm thread 50 formed thereon. Knob 26 is positioned within escutcheon member 51 and maintained in position by retainer ring 52. A mating gear 53 is disposed to be rotated or driven in response to angular displacement of adjustment knob 26. The shaft 54 on which driven gear 53 is mounted is likewise driven by rotation of knob 26, and this motion is utilized to drive movable arm 55 to control potentiometer 56, which may be any of the control potentiometers ordinarily utilized in television receivers, such as the volume control, horizontal or vertical scansion frequency control, brightness control, contrast control, etc. Thus the visual display of the selected frequency channel is retained, the information being provided upon an adjustment knob which varies an operating or amplitude characteristic of the television receiver other than channel selection or fine tuning.

While particular embodiments of the present invention have been shown and described, it is apparent that changes and modifications may be made without departing from the invention in its broader aspects. The aim of the appended claims, therefore, is to cover all such changes and modifications as fall within the true spirit and scope of the invention.

I claim:

1. A wave-signal receiver comprising: a cabinet including a front panel presenting a viewing area and a plurality of other panels which, with said front panel, collectively define an enclosure; means for selectively tuning said receiver to any of a plurality of frequency channels; control means disposed in one of said panels and coupled to said tuning means to effect actuation thereof; means including an adjustment knob disposed in said front panel for varying an operating characteristic of said receiver during the reception of any selected one of said channels, said knob having an exposed portion including a translucent screen area; an index member having indicia individually shaped to designate a particular one of said frequency channels and mounted for movement to present said indicia sequentially at a reference position; means mechanically linking said tuning means to said index member to effect movement of said member in response to actuation of said tuning means; and a light source positioned to project onto said screen an image of the one of said indicia in said reference position.

2. A wave-signal receiver comprising: a cabinet including a front panel presenting a viewing area and a plurality of other panels which, with said front panel, collectively define an enclosure; means for selectively tuning said receiver to any of a plurality of frequency channels; control means disposed in one of said panels and coupled to said tuning means to effect actuation thereof; means including an adjustment knob disposed in said front panel for varying an operating characteristic of said receiver during the reception of any selected one of said channels, said knob having an exposed portion including a translucent screen area and a rear closure portion including a central aperture and a plurality of transparent areas arranged in a predetermined pattern about said central aperture; an index member having indicia individually shaped to designate a particular one of said frequency channels and mounted between said screen area and said rear closure for movement to present said indicia sequentially at a reference position; means projecting through said central aperture for mechanically linking said tuning means to said index member to effect movement of said member in response to actuation of said tuning means; and a light source positioned to project through one of said transparent areas onto said screen an image of the one of said indicia in said reference position.

3. A wave-signal receiver comprising: a cabinet including a front panel presenting a viewing area and a plurality of other panels which, with said front panel, collectively define an enclosure; means for selectively tuning said receiver to any of a plurality of frequency channels; control means disposed in one of said panels and coupled to said tuning means to effect actuation thereof; means including an adjustment knob disposed in said front panel for varying an operating characteristic of said receiver during the reception of any selected one of said channels, said knob having an exposed portion including a translucent screen area; a substantially circular index member having indicia individually shaped to designate a particular one of said frequency channels and mounted within and independently of said adjustment knob for movement to present said indicia sequentially at a reference position; means mechanically linking said tuning means to said index member to effect angular movement of said member in response to actuation of said tuning means; and a light source positioned to project onto said screen an image of the one of said indicia in said reference position.

4. A wave-signal receiver comprising: a cabinet including a front panel presenting a viewing area and a plurality of other panels which, with said front panel, collectively define an enclosure; means for selectively tuning said receiver to any of a plurality of frequency channels; control means disposed in one of said panels and coupled to said tuning means to effect actuation thereof; means including an adjustment knob disposed in said front panel for varying an operating characteristic of said receiver during the reception of any selected one of said channels, said knob having an exposed portion including a translucent screen area and a threaded rear portion; an index member having indicia individually shaped to designate a particular one of said frequency channels and mounted for movement to present said indicia sequentially at a reference position; means mechanically linking said tuning means to said index member to effect movement of said member in response to actuation of said tuning means; a light source positioned to project onto said screen an image of the one of said indicia in said reference position; a driven gear rotatably mounted in mating engagement with said threaded rear portion; and shaft means connected to said driven gear for varying said operating characteristic in response to rotation of said driven gear.

5. A wave-signal receiver comprising: a cabinet including a front panel presenting a viewing area and a plurality of other panels which, with said front panel, collectively define an enclosure; means for selectively tuning said receiver to any of a plurality of frequency channels; control means disposed in one of said other panels and coupled to said tuning means to effect actuation thereof; means including an adjustment knob disposed in said front panel for varying an operating characteristic of said receiver during the reception of any selected one of said channels, said knob having a hollow, substantially cylindrical body section; a first closure section affixed near one end of said body section and including a translucent screen area; a second closure section affixed at the opposite end of said body section, including a central aperture and a plurality of transparent areas arranged in a predetermined pattern about said central aperture; an index member having indicia individually shaped to designate a particular one of said frequency channels and mounted within and independently of said adjustment knob between said screen area and said second closure section for movement to present said indicia sequentially at a reference position; shaft means projecting through said central aperture for mechanically linking said tuning means to said index member to effect movement of said member in response to actuation of said tuning means; and a light source positioned to project through one of said transparent areas onto said screen an image of the one of said indicia in said reference position.

6. A wave-signal receiver comprising: a cabinet including a front panel presenting a viewing area and a plurality of other panels which, with said front panel, collectively define an enclosure; means for selectively tuning said receiver to any of a plurality of frequency channels; control means disposed in one of said panels and coupled to said tuning means to effect actuation thereof; means including an adjustment knob disposed in said front panel for effecting fine tuning of said receiver during the reception of any selected one of said channels, said knob having an exposed portion including a translucent screen area; an index member having indicia individually shaped to designate a particular one of said frequency channels and mounted for movement to present said indicia sequentially at a reference position; means mechanically linking said tuning means to said index member to effect movement of said member in response to actuation of said tuning means; and a light source positioned to project onto said screen an image of the one of said indicia in said reference position.

7. A wave-signal receiver comprising: a cabinet including a front panel presenting a viewing area and a plurality of other panels which, with said front panel, collectively define an enclosure; means for selectively tuning said receiver to any of a plurality of frequency channels; control means disposed in one of said panels and coupled to said tuning means to effect actuation thereof; means including an adjustment knob disposed in said front panel for varying an operating characteristic of said receiver in addition to the tuning during the reception of any selected one of said channels, said knob having an exposed portion including a translucent screen area; an index member having indicia individually shaped to designate a particular one of said frequency channels and mounted for movement to present said indicia sequentially at a reference position; means mechanically linking said tuning means to said index member to effect movement of said member in response to actuation of said tuning means; and a light source positioned to project onto said screen an image of the one of said indicia in said reference position.

8. A wave-signal receiver comprising: a cabinet including a front panel presenting a viewing area and a plurality of other panels which, with said front panel, collectively define an enclosure; means for selectively tuning said receiver to any of a plurality of frequency channels; control means disposed in one of said panels and coupled to said tuning means to effect actuation thereof; means including an adjustment knob disposed in said front panel for varying an amplitude characteristic of said receiver during the reception of any selected one of said channels, said knob having an exposed portion including a translucent screen area; an index member having indicia individually shaped to designate a particular one of said frequency channels and mounted for movement to present said indicia sequentially at a reference position; means mechanically linking said tuning means to said index member to effect movement of said member in response to actuation of said tuning means; and a light source positioned to project onto said screen an image of the one of said indicia in said reference position.

9. A wave-signal receiver comprising: a cabinet including a front panel presenting a viewing area and a plurality of other panels which, with said front panel, collectively define an enclosure; means for selectively tuning said receiver to any of a plurality of frequency channels; control means disposed in one of said panels and coupled to said tuning means to effect actuation thereof; means including an adjustment knob disposed in said front panel for accomplishing volume control of said receiver during reception of any selected one of said channels, said knob having an exposed portion including a translucent screen area; an index member having indicia individually shaped to designate a particular one of said frequency channels and mounted for movement to present said indicia sequentially at a reference position; means mechanically linking said tuning means to said index member to effect movement of said member in response to actuation of said tuning means; and a light source positioned to project onto said screen an image of the one of said indicia in said reference position.

10. A wave-signal receiver comprising: a cabinet including a front panel presenting a viewing area, a rear panel, and a plurality of other panels which, with said front and rear panels, collectively define an enclosure; means including a tuning shaft extending from said rear panel toward said front panel for selectively tuning said receiver to any of a plurality of frequency channels; channel selector means disposed on said rear panel and coupled to the rear portion of said tuning shaft to effect actuation of said tuning means; means including an adjustment knob disposed in said front panel for varying an operating characteristic of said receiver during the reception of any selected one of said channels, said knob having an exposed portion including a translucent screen area; an index member coupled to the front portion of said tuning shaft and having indicia individually shaped to designate a particular one of said frequency channels, said member being mounted for movement in response to actuation of said tuning means to present said indicia sequentially at a reference position; and a light source positioned to project onto said screen an image of the one of said indicia in said reference position.

11. A wave-signal receiver comprising: a cabinet including a front panel presenting a viewing area, a rear panel, and a plurality of other panels which, with said front and rear panels, collectively define an enclosure; means including a channel tuning shaft extending from said rear panel toward said front panel for selectively tuning said receiver to any of a plurality of frequency channels; channel selector means disposed on said rear panel and coupled to the rear portion of said channel tuning shaft to effect actuation of said tuning means; a fine tuning shaft coupled to said tuning means, enclosing and coaxial with the front portion of said channel tuning shaft, and extending toward said front panel; means including an adjustment knob disposed in said front panel and coupled to the front portion of said fine tuning shaft for varying the fine tuning of said receiver during the reception of any selected one of said channels, said knob having an exposed portion including a translucent screen area; an index member coupled to the front portion of said channel tuning shaft and having indicia individually shaped to designate a particular one of said frequency channels, said member being mounted for movement in response to actuation of said tuning means to present said indicia sequentially at a reference position; and a light source positioned to project onto said screen an image of the one of said indicia in said reference position.

12. A wave-signal receiver comprising: a cabinet including a front panel presenting a viewing area, a rear panel, and a plurality of other panels which, with said front and rear panels, collectively define an enclosure; means including a tuning shaft extending from said rear panel toward said front panel for selectively tuning said receiver to any of a plurality of frequency channels; adjustable means for controlling an operating characteristic of said receiver other than channel selection during the reception of any selected one of said channels; channel selector means disposed on said rear panel and coupled to the rear portion of said tuning shaft to effect actuation of said tuning means; an adjustment knob disposed in said front panel and coupled to said adjustable means, said knob being coaxial with said tuning shaft and having an exposed portion including a translucent screen area; an index member, encircled by said adjustment knob and coupled to the front portion of said tuning shaft, said member having indicia individually shaped to designate a particular one of said frequency channels and mounted for movement in response to actuation of said tuning means to present said indicia sequentially at a reference position; and a light source positioned to project onto said screen an image of the one of said indicia in said reference position.

References Cited in the file of this patent

UNITED STATES PATENTS

| | | |
|---|---|---|
| 2,681,634 | Polley | June 22, 1954 |
| 2,808,018 | Foster | Oct. 1, 1957 |
| 2,823,639 | Vistain | Feb. 18, 1958 |

OTHER REFERENCES

Publication, "Rider Television Manual," volume VI, Zenith T.V., pages 6, 7 and 6 to 10.